(12) United States Patent
Murayama

(10) Patent No.: US 8,139,116 B2
(45) Date of Patent: Mar. 20, 2012

(54) RANGE IMAGE SYSTEM FOR OBTAINING SUBJECT IMAGE OF PREDETERMINED DISTANCE POSITION

(75) Inventor: Jin Murayama, Miyagi (JP)

(73) Assignee: Fujifilm Corporation, Tokyo (JP)

( * ) Notice: Subject to any disclaimer, the term of this patent is extended or adjusted under 35 U.S.C. 154(b) by 1313 days.

(21) Appl. No.: 11/812,219

(22) Filed: Jun. 15, 2007

(65) Prior Publication Data

US 2008/0122933 A1 May 29, 2008

(30) Foreign Application Priority Data

Jun. 28, 2006 (JP) .................. 2006-177702

(51) Int. Cl.
*H04N 5/33* (2006.01)
(52) U.S. Cl. .................. 348/164; 348/135; 356/5.04
(58) Field of Classification Search .................. 348/162, 348/164, 135; 356/5.04
See application file for complete search history.

(56) References Cited

U.S. PATENT DOCUMENTS

| 6,057,909 | A  | * | 5/2000 | Yahav et al. ............. 356/5.04 |
| 6,856,355 | B1 | * | 2/2005 | Ray et al. ............. 348/370 |
| 7,477,361 | B2 | * | 1/2009 | Murayama ............. 356/4.01 |

* cited by examiner

*Primary Examiner* — David Lazaro
(74) *Attorney, Agent, or Firm* — Birch, Stewart, Kolasch & Birch, LLP

(57) ABSTRACT

A solid-state imaging device has a single plate structure and is capable of imaging of visible light and infrared light. While imaging of the visible light and the infrared light is performed by the imaging device every one-frame scanning period, an IR pulse is emitted, every other one-frame scanning period, to a space to be shot. A visible-light image is produced every one-frame scanning period. A range image from which influence to be caused by infrared component of the ambient light is removed is produced every other one-frame scanning period by subtracting an IR pixel image (S2IR), which is obtained by imaging of non-emission time of the IR pulse, from an IR pixel signal (S1IR), which is obtained by imaging of emission time of the IR pulse.

9 Claims, 8 Drawing Sheets

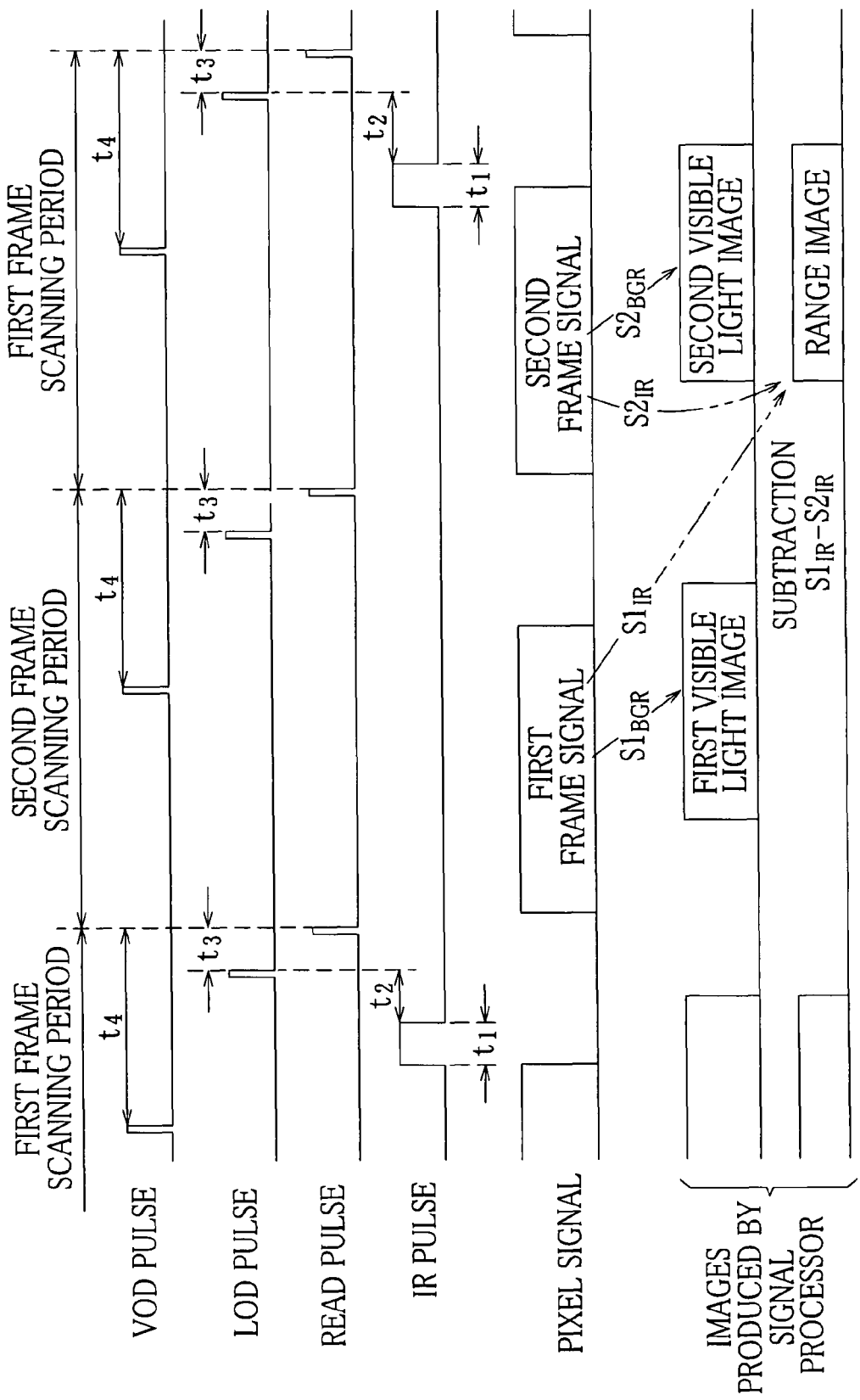

RANGE IMAGE SYSTEM FOR OBTAINING SUBJECT IMAGE OF PREDETERMINED DISTANCE POSITION

FIELD OF THE INVENTION

The present invention relates to a range image system for obtaining a subject image (range image) residing at a position of a predetermined distance, and particularly relates to a range image system for obtaining both of a range image and a normal image (visible-light image).

BACKGROUND OF THE INVENTION

In recent years, a range image system utilizing an optical-path-difference detection method is known (see U.S. Pat. No. 6,057,909, for instance). In this detection method, infrared pulsed light is emitted to a space to be shot, and the pulsed light reflected by a subject is taken after a predetermined period to obtain a subject image (range image) residing at a position of a predetermined distance (optical path difference). The range image system described in the above-noted US Patent employs a solid-state imaging device for receiving the infrared light. Further, a high-speed shutter device of an electrooptical shutter, an image intensifier and so forth is provided for the purpose of receiving only the pulsed light reflected by the subject located at the predetermined distance.

With respect to the range image system, obtaining a normal visible-light image simultaneously with the range image is useful in clipping a specified subject from the image (in separating the background) and in producing a three-dimensional image. However, the solid-state imaging device employed in the range image system is intended to receive the infrared light. Thus, another solid-state imaging device for receiving the visible light is required to simultaneously obtain both of the range image and the visible-light image. In addition, a prism and so forth are also required for guiding incident light to the respective solid-state imaging devices.

In this regard, the assignee of this application proposes a solid-state imaging device in which a structure of the range image system is simplified for the purpose of improving its size and its cost (see Japanese Patent Application No. 2006-172649). This solid-state imaging device is capable of simultaneously receiving the visible light and the infrared light, although a single plate structure is adopted. This solid-state imaging device is also capable of independently controlling light receiving periods of the infrared light and the visible light. By employing this imaging device, the prism and the shutter device become unnecessary so that the structure of the range image system is simplified.

By the way, the above-mentioned range image system obtains the range image by using the infrared light having a wavelength which is different from that of the visible light, so as not to affect a human gaze and normal shooting. However, the infrared light actually entering the range image system includes not only reflection component of the pulsed light, which is emitted from an infrared emitting device and is reflected by a subject, but also infrared-light component existing in the ambient light of the sunlight, the incandescent light and so forth. Due to this, range imaging is affected. Consequently, there arises a problem in that an S/N ratio of the range image remarkably deteriorates in some conditions and it is impossible to correctly obtain range information.

SUMMARY OF THE INVENTION

In view of the foregoing, it is a primary object of the present invention to provide a range image system in which a range image is obtained simultaneously with a visible-light image and is prevented from deteriorating due to infrared component included in the ambient light.

In order to achieve the above and other objects, the range image system according to the present invention comprises an infrared emitting device, an imaging device, an imaging controller, an emission controller, a first frame memory, a second frame memory and a signal processor. The infrared emitting device emits infrared pulsed light to a scene. The imaging device receives the visible light and the infrared light from the scene by two-dimensionally arranged first and second light receive elements. The first light receive element receives the visible light. The second light receive element receives the infrared light. The imaging device photoelectrically converts the received visible light and the received infrared light to output a first pixel signal corresponding to a charge amount of signal charge accumulated in the first light receive element, and to output a second pixel signal corresponding to a charge amount of signal charge accumulated in the second light receive element. The imaging controller activates the imaging device to periodically output the first and second pixel signals of one frame every one-frame scanning period. In addition, the imaging controller delays a light-receiving period of the second light receive element by a predetermined time from the emission of the pulsed light of the infrared emitting device so as to receive the pulsed light reflected from a position of a predetermined distance. The emission controller controls emission timing of the infrared emitting device to perform the emission of the pulsed light every other one-frame scanning period. The first frame memory stores the first and second pixel signals of one frame obtained by imaging of the emission time of the pulsed light. The second frame memory stores the first and second pixel signals of one frame obtained by imaging of the non-emission time of the pulsed light. The signal processor produces a first visible-light image on the basis of the first pixel signal stored in the first frame memory, and produces a second visible-light image on the basis of the first pixel signal stored in the second frame memory. Further, the signal processor produces a range image by subtracting the second pixel signal stored in the second frame memory, from the second pixel signal stored in the first frame memory. Incidentally, it is preferable to provide an image memory for storing the first and second visible-light images and the range image produced by the signal processor.

The imaging device is a solid-state imaging device in which the respective parts are formed in a well layer of either conductivity type of n-type or p-type. The well layer is formed in a surface layer of a semiconductor substrate of the other conductivity type. The solid-state imaging device includes the first and second light receive elements, a vertical overflow drain, a lateral overflow drain, readout gates, a vertical transfer portion, a horizontal transfer portion and a signal output portion. The vertical overflow drain sweeps the signal charges of the first and second light receive elements to the semiconductor substrate. The lateral overflow drain sweeps the signal charge of the second light receive element via an elimination gate to a drain region formed in the well layer. A conductivity type of the drain region is opposite to that of the well layer. The readout gate reads the signal charges from the first and second light receive elements. The vertical transfer portion vertically transfers the signal charge read by the readout gate. The horizontal transfer portion horizontally transfers the signal charge received from the vertical transfer portion. The signal output portion converts the signal charge, which is horizontally transferred by the horizontal transfer portion, into a pixel signal corresponding to the charge amount. The converted pixel signal is outputted from the signal output portion. It is preferable that a visible-light receiving period and an infrared-light receiving period are different and are individually set. For this reason, the imaging controller activates the imaging device so as to firstly sweep the signal charges from the first and second light receive elements through the vertical overflow drain, and so as to successively sweep the signal charge from the second light receive element through the lateral overflow drain, and then so as to read the signal charges from the first and second light receive elements through the readout gate.

The range image system of the present invention performs imaging of the visible light and the infrared light every one-frame scanning period and performs the emission of the infrared pulsed light every other one-frame scanning period. The range image system produces the visible-light image every one-frame scanning period. In addition, the infrared pixel signal obtained by imaging of the non-emission time of the pulsed light is subtracted from the infrared pixel signal obtained by imaging of the emission time of the pulsed light to produce the range image. Thus, while the visible-light image is produced, it is possible to simultaneously produce the range image from which influence to be caused by the infrared component of the ambient light is removed.

The range image system of the present invention has a single-plate structure and is capable of receiving the visible light and the infrared light. Further, the range image system is equipped with the solid-state imaging device capable of independently controlling the light receiving periods of the infrared light and the visible light. Thus, it is possible to simplify the structure of the range image system and it is also possible to improve the size and the cost thereof.

BRIEF DESCRIPTION OF THE DRAWINGS

FIG. 8 is a timing diagram showing drive timing of the range image system.

DESCRIPTION OF THE PREFERRED EMBODIMENTS

Figure 1:
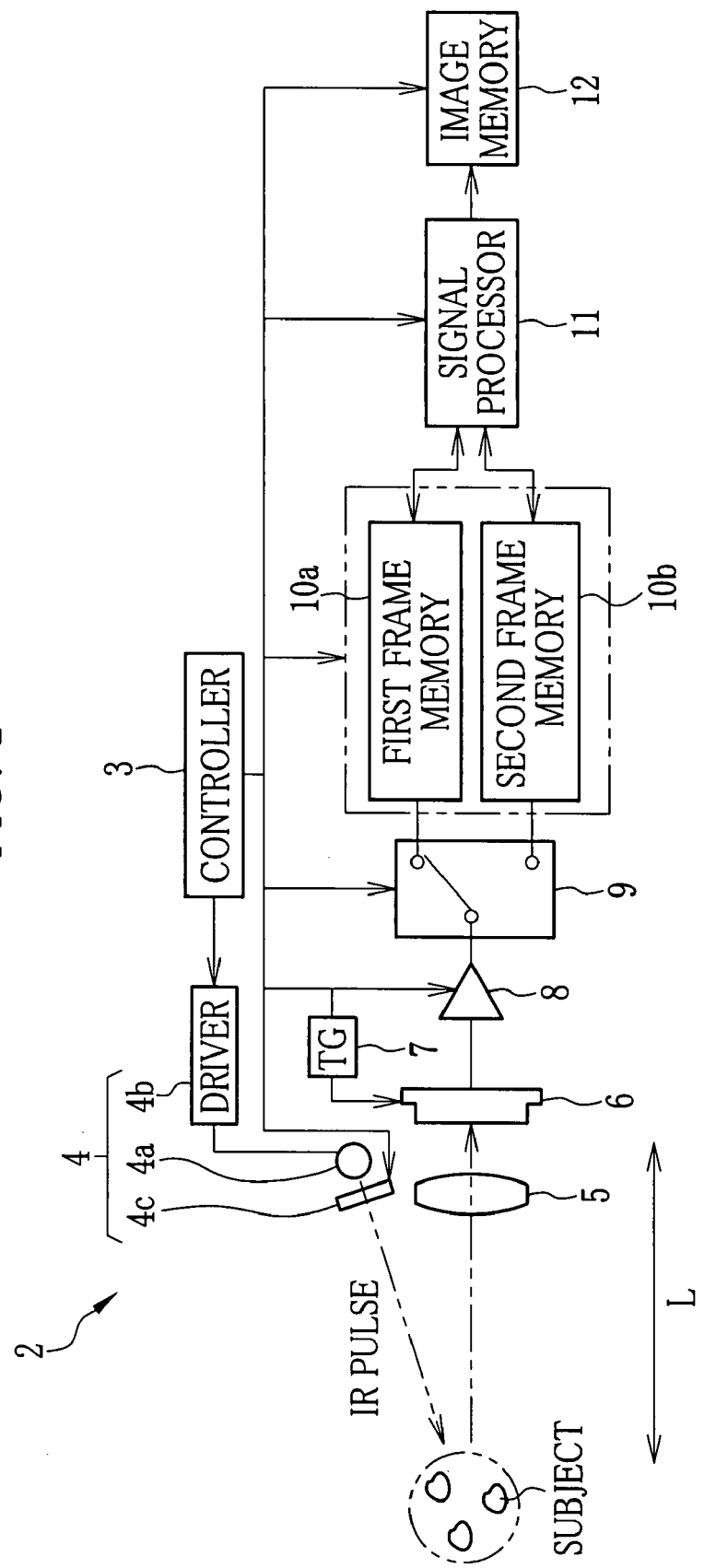
FIG. 1 is a block diagram showing a structure of a range image system.

In FIG. 1, a range image system 2 according to the present invention comprises a controller 3, an IR emitting device 4, a lens 5, a solid-state imaging device 6, a timing generator (TG) 7, an A/D converter 8, a recording-destination changer 9, first and second frame memories 10a and 10b, a signal processor 11 and an image memory 12. The controller 3 integrally controls the respective sections of the range image system 2. The IR emitting device 4 emits infrared (IR) light toward a space to be shot. The lens 5 condenses the visible light and the IR light from the space to be shot. The solid-state imaging device 6 photoelectrically converts the light condensed by the lens 5 to output pixel signals. The timing generator 7 generates various kinds of drive pulses for activating the solid-state imaging device 6. The A/D converter 8 digitizes the pixel signal outputted from the imaging device 6. The recording-destination changer 9 changes a recording destination of the digitized pixel image every one-frame scanning period. The pixel signal of one frame is written in the first and second frame memories 10a and 10b alternately via the recording-destination changer 9. The signal processor 11 processes the pixel signals written in the first and second frame memories 10a and 10b to produce a visible-light image and a range image. The image memory 12 stores the visible-light image and the range image produced by the image processor 11.

The IR emitting device 4 includes a light source 4a of an LED (Light Emitting Diode), a laser diode and so forth for emitting the IR light (whose wavelength is 850 nm, for example). The IR emitting device 4 further includes a driver 4b for activating the light source 4a, and a modulator 4c for modulating the IR light of the light source 4a to a pulse shape to radiate the pulsed IR light (hereinafter referred to as IR pulse) to the space to be shot. The IR emitting device 4 is controlled by the controller 3 so as to emit the IR pulse every one-frame scanning period. In this way, the controller 3 also works as a light-emitting controller. Incidentally, it is possible to produce the IR pulse by modulating a light-source driving signal of the driver 4b without providing the modulator 4c.

The lens 5 condenses the IR pulse reflected by a subject together with a normal subject light caused by the ambient light of the sunlight and so forth. The IR pulse and the subject light enter the solid-state imaging device 6. When the subjects reside at plural distance positions such as shown in FIG. 1, the IR pulses reflected by the respective subjects enter the solid-state imaging device 6 at different incident timing in accordance with the distance position (optical path difference) of each subject. The light source 4a and the solid-state imaging device 6 are located at a substantially same position. When L denotes a distance extending from the position, where the light source 4a and the imaging device 6 are located, to a certain subject and c denotes the velocity of light, TOF (Time of Flight) $\tau$ is represented by $\tau = 2L/c$. During the TOF, the IR pulse emitted from the light source 4a is reflected by the subject concerned and enters the solid-state imaging device 6.

The TG 7 periodically activates the solid-state imaging device 6 so as to output the pixel signal of one frame every one-frame scanning period by a full-pixel reading method. The TG 7 works as an imaging controller. The solid-state imaging device 6 receives the normal subject light (including not only the visible light but also IR-light component of the ambient light) in the respective frame scanning periods. Moreover, the solid-state imaging device 6 receives the IR pulse, which is emitted from the IR emitting device 4 every other one-frame scanning period and is reflected by the subject of the predetermined distance position, at predetermined timing to sequentially output the pixel signals corresponding to the respective pixels of B (Blue), G (Green), R (Red) and IR. The analog pixel signals outputted from the solid-state imaging device 6 are digitized by the A/D converter 8 in order, and the digitized pixel signals are inputted into the recording-destination changer 9 by which the recording destinations (the first frame memory 10a or the second frame memory 10b) of the inputted pixel signal is changed every one-frame scanning period.

The first frame memory 10a stores the pixel signal (hereinafter referred to as first frame signal) outputted in the second frame scanning period. In this regard, receiving the light is performed in the preceding first frame scanning period during which the IR emitting device 4 irradiates the light. On the other hand, the second frame memory 10b stores the pixel signal (hereinafter referred to as second frame signal) outputted in the first frame scanning period. In this regard, receiving the light is performed in the preceding second frame scanning period during which the IR emitting device 4 does not emit the light.

The signal processor 11 produces a first visible-light image from the pixel signal of B, G and R included in the first frame signal, and also produces a second visible-light image from the pixel signal of B, G and R included in the second frame signal. In addition, the signal processor 11 produces the range image by subtracting the pixel signal of the IR included in the second frame signal (IR-light component of the ambient light) from the pixel signal of the IR included in the first frame signal (total of the IR-light component of the ambient light and the reflection component of the IR light emitted from the IR emitting device 4 and reflected by the subject) every corresponding pixel. In other words, the signal processor 11 produces the visible-light image every one-frame scanning period and produces the range image at intervals of one-frame scanning period. The image memory 12 sequentially stores the respective visible-light images and the range image which are produced by the signal processor 11. Incidentally, the pixel signals of B, G and R correspond to the first pixel signal recited in the claims, and the pixel signal of IR corresponds to the second pixel signal recited in the claims.

Figure 2:
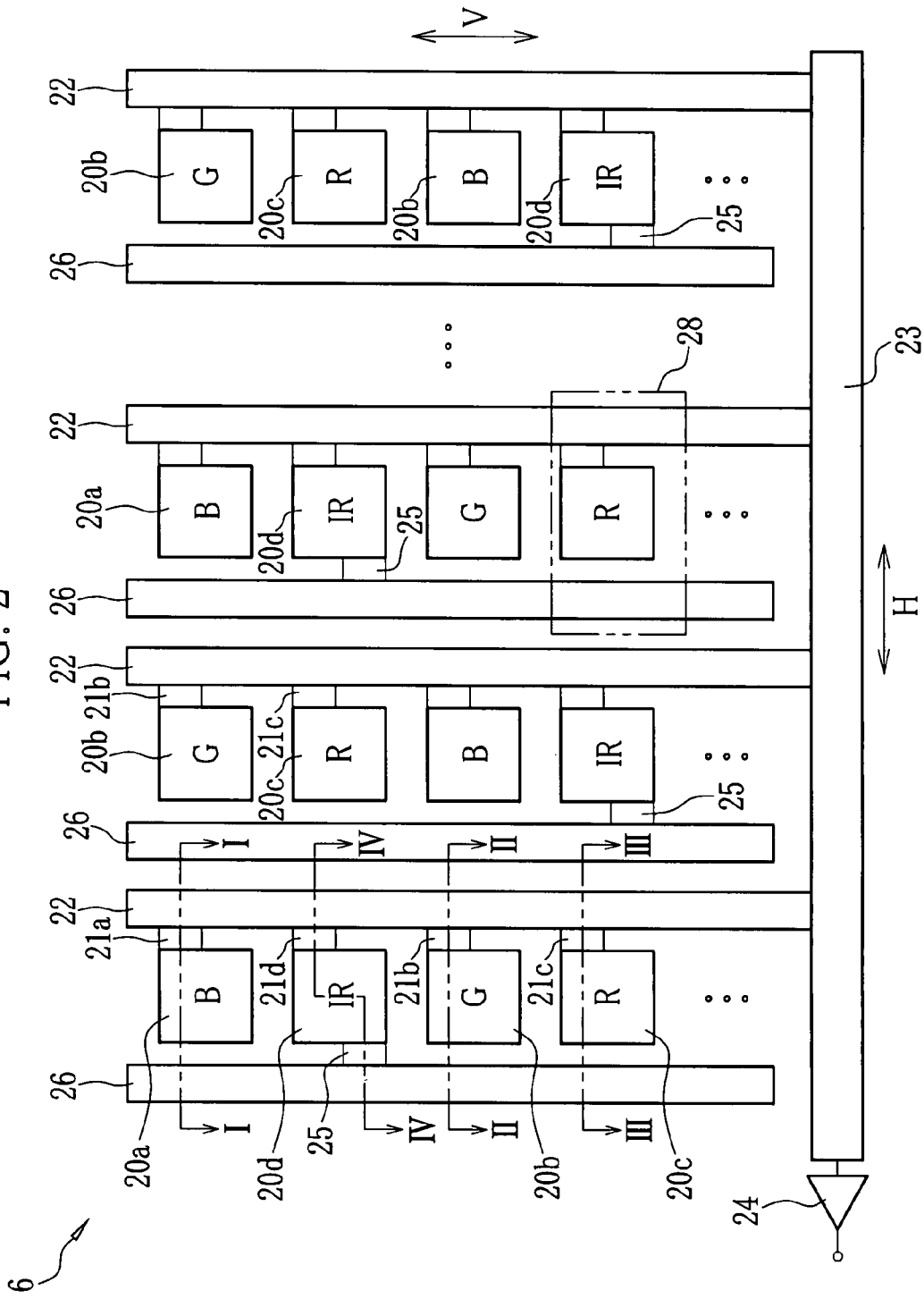
FIG. 2 is a schematic plan view showing a structure of a solid-state imaging device.

FIG. 2 shows a structure of the solid-state imaging device 6, which is a CCD image sensor of an interline transfer system. The solid-state imaging device 6 comprises a B-light receive element 20a, a G-light receive element 20b, an R-light receive element 20c, an IR-light receive element 20d, readout gates (RG) 21a to 21d, a vertical CCD 22, a horizontal CCD 23, an output amplifier 24, an elimination gate (EG) 25 and a drain region 26. The B-light receive element 20a receives the blue (B) light to store a B-signal charge. The G-light receive element 20b receives the green (G) light to store a G-signal charge. The R-light receive element 20c receives the red (R) light to store an R-signal charge. The IR-light receive element 20d receives the infrared (IR) light to store an IR-signal charge. The readout gates 21a to 21d read the signal charges from the light receive elements 20a to 20d. The vertical CCD 22 vertically transfers the signal charges. The horizontal CCD 23 horizontally transfers the signal charges. The output amplifier 24 converts the signal charge into a voltage signal to be outputted. The elimination gate 25 is connected to the IR-light receive element 20d. The signal charge of the IR-light receive element 20d is swept to the drain region 26. The EG 25 and the drain region 26 compose a lateral overflow drain (LOD). Meanwhile, under the light receive elements 20a to 20d, a vertical overflow drain (VOD) is composed of thin portions 31a to 31d of a p well layer 31 and an n-type semiconductor substrate 30, which are described later. Incidentally, the light receive elements 20a to 20c correspond to the first light receive element recited in the claims, and the light receive element 20d corresponds to the second light receive element recited in the claims.

The light receive elements 20a to 20d are vertically and horizontally arrayed in a plane (in a V-direction and an H-direction). As a whole, the light receive elements 20a to 20d are arranged in a square lattice form. The B-light receive element 20a, the G-light receive element 20b, the R-light receive element 20c and the IR-light receive element 20d are respectively denoted by "B", "G", "R" and "IR" to show an arrangement order. The light receive elements 20a to 20d are vertically arranged in an order of B, IR, G, R, B, IR . . . and this arrangement cycle is shifted by half cycle (corresponding to two pixels) regarding an odd row and an even row. Consequently, in the horizontal direction, an odd line is composed of the alternately arranged B-light receive elements 20a and the G-light receive elements 20b, and an even line is composed of the alternately arranged IR-light receive elements 20d and the R-light receive elements 20c. The respective light receive elements 20a to 20d are uniformly arranged at a rate of one to four pixels.

Figure 3:
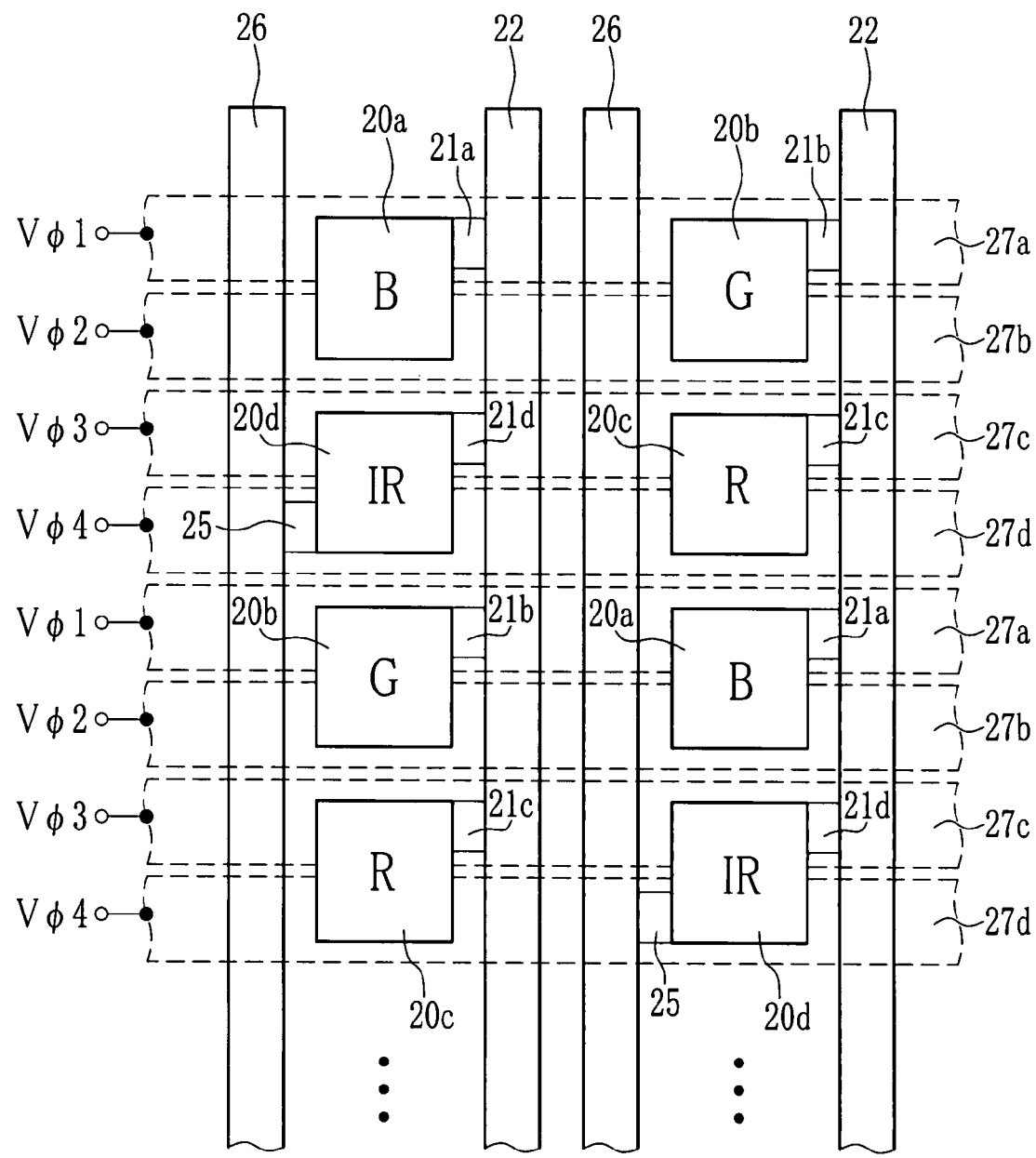
FIG. 3 is a schematic plan view showing a structure of vertical transfer electrodes.

The vertical CCD 22 is disposed for each of the vertical rows of the light receive elements 20a to 20d. The readout gates 21a to 21d are respectively disposed between the vertical CCD 22 and each of the light receive elements 20a to 20d. The vertical CCD 22 reads the signal charges of B, G, R and IR from the light receive elements 20a to 20d via the readout gates 21a to 21d respectively. The vertical CCDs 22 vertically transfer the read signal charges one line by one line to the horizontal CCD 23. As shown in FIG. 3, the vertical transfer of the vertical CCD 22 is controlled by four-phase drive based on vertical transfer pulses V$\phi$1 to V$\phi$4 applied to four vertical transfer electrodes 27a to 27d. In this regard, the transfer electrodes 27a to 27d are provided for the respective pixel lines two by two. Among the vertical transfer electrodes 27a to 27d, the electrode 27a to which the vertical transfer pulse V$\phi$1 of the first phase is applied is also used as a readout gate electrode of the RG 21a and the RG 21b. The vertical transfer electrode 27c to which the vertical transfer pulse V$\phi$3 of the third phase is applied is also used as a readout gate electrode of the RG 21c and the RG 21d. Further, the vertical transfer electrode 27d to which the vertical transfer pulse V$\phi$4 of the fourth phase is applied is also used as an elimination gate electrode of the EG 25.

The horizontal CCD 23 is activated in two phases based on horizontal transfer pulses H$\phi$1 and H$\phi$2 applied to horizontal transfer electrodes (not shown) to horizontally transfer the signal charges of one-line, which are transferred from the vertical CCDs 22, toward the output amplifier 24. For example, the output amplifier 24 is a floating diffusion amplifier to detect the signal charges transferred from the horizontal CCD 23. The output amplifier 24 converts the detected signal charge into the voltage signal in accordance with a charge amount thereof to sequentially output the pixel signals corresponding to the respective light receive elements 20a to 20d.

The drain region 26 is disposed for each of the vertical rows of the light receive elements 20a to 20d and is connected via the EG 25 to the IR-light receive element 20d belonging to the corresponding row. The signal charge is swept from the IR-light receive element 20d to the drain region 26.

Incidentally, a rectangular region 28 shown in FIG. 2 represents a single pixel region.

Figure 4:
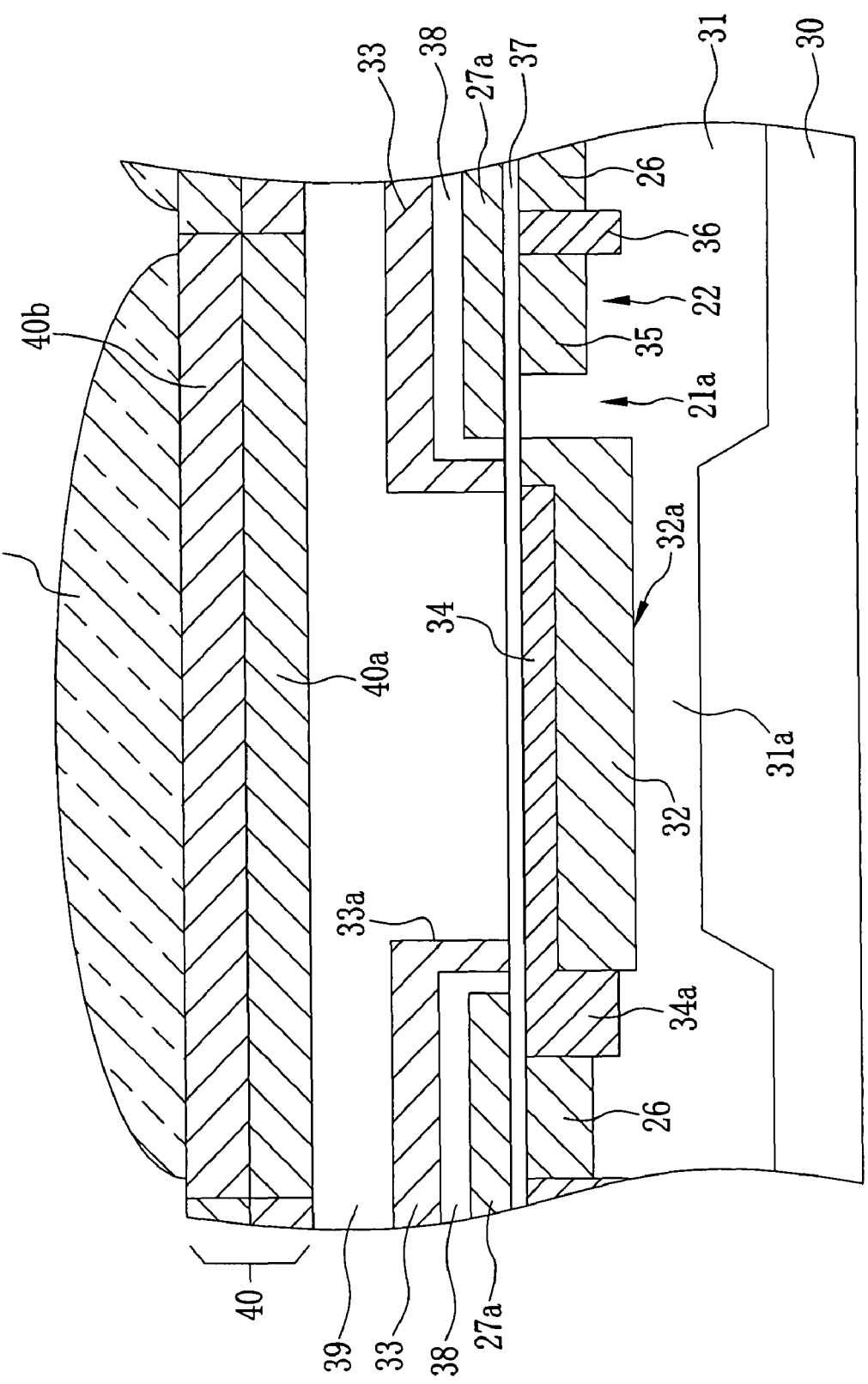
FIG. 4 is a schematic section view taken along I-I line shown in FIG. 2.

FIG. 4 is a section view taken along the I-I line of FIG. 2 and showing the pixel including the B-light receive element 20a. The p well layer 31 is formed in a surface layer of the n-type semiconductor substrate (n-type silicone substrate) 30. A B-signal charge accumulator 32 comprising an n-type semiconductor layer is formed at a deep portion of the p well layer 31. The B-signal charge accumulator 32 spreads in a layer state under an opening 33a of a light shielding film 33, and one end thereof located in the horizontal direction reaches the surface of the p well layer 31.

A pn junction 32a is formed at an interface of the B-signal charge accumulator 32 and the underlying p well layer 31 to compose a photodiode for photoelectrically converting the B-light and for producing the B-signal charge. The pn junction 32a is formed at a comparatively shallow position so as to have high sensitivity relative to the B-light whose wavelength is short and whose distance entering from the surface of the p well layer 31 is short. The p well layer 31 is thinly formed under the B-signal charge accumulator 32, and this thin portion 31a works as a potential barrier of the VOD. When a VOD pulse is applied to the n-type semiconductor substrate 30 as a substrate voltage, the potential barrier of the thin portion 31a lowers and the signal charge of the B-signal charge accumulator 32 is swept to the n-type semiconductor substrate 30.

In a surface portion of the p well layer 31 located under the opening 33a, a p⁺ layer 34 to which p-type impurity is added in high concentration is formed for the purpose of preventing occurrence of dark-current component. Moreover, in the surface portion of the p well layer 31 located under the light shielding film 33, a transfer channel 35 and the drain region 26 are formed. The transfer channel 35 comprises an n-type semiconductor layer and the drain region 26 comprises an n⁺-type semiconductor layer. The transfer channel 35 and the drain region 26 are separated by a pixel separation portion 36 comprising a P⁺-type semiconductor layer.

The transfer channel 35 is separated from the B-signal charge accumulator 32 via the p well layer 31. Above this separation portion and the transfer channel 35, the aforementioned vertical transfer electrode 27a is formed via a transparent gate insulation film 37 formed on the whole surface. The transfer channel 35 extends in the vertical direction (V-direction shown in FIG. 2) to compose the vertical CCD 22 of the four-phase drive with the vertical transfer electrodes 27a to 27d intersecting an above portion of the transfer channel 35. Moreover, the separation portion of the transfer channel 35 and the B-signal charge accumulator 32 composes the aforementioned RG 21a with the vertical transfer electrode 27a. Upon applying a high-voltage read pulse to the vertical transfer electrode 27a, the B-signal charge of the B-signal charge accumulator 32 is transmitted to the transfer channel 35 via the separation portion. And then, the B-signal charge is moved inside the transfer channel 35 in accordance with the vertical transfer pulses Vφ1 to Vφ4 applied to the vertical transfer electrodes 27a to 27d.

The drain region 26 is separated from the B-signal charge accumulator 32 via an extension portion 34a of the p⁺ layer 34 spreading under the light shielding film 33. Above this separation portion and the drain region 26, the vertical transfer electrode 27a is formed via the gate insulation film 37. Since the extension portion 34a of the p⁺ layer 34 works as a channel stopper, a channel is not formed at this portion even if the read pulse is applied to the vertical transfer electrode 27a. Thus, the signal charge of the B-signal charge accumulator 32 is prevented from being swept to the drain region 26.

The light shielding film 33 covers the vertical transfer electrodes 27a to 27d via an interlayer insulation film 38 and the opening 33a is formed therein to make the light enter the above-described photodiode. A planarizing layer 39 made of transparent insulator is formed on the light shielding film 33 and the gate insulation film 37 exposed from the opening 33a. Further, on the planarizing layer 39, a spectroscopic layer 40 is formed to selectively transmit the light in accordance with its wavelength.

The spectroscopic layer 40 is composed of plural kinds of optical filters segmented every pixel. A B-filter 40a and an IR cut filter 40b are stacked in order on the planarizing layer 39 of the pixel concerned. The B-filter 40a transmits only the light included between the visible light and the B-light (wavelength of which is about 400 nm to 500 nm). The IR cut filter 40b cuts the IR light (wavelength of which is about 800 nm to 1500 nm). Further, on the spectroscopic layer 40, is disposed a microlens 41 for condensing the light into the opening 33a.

Figure 5:
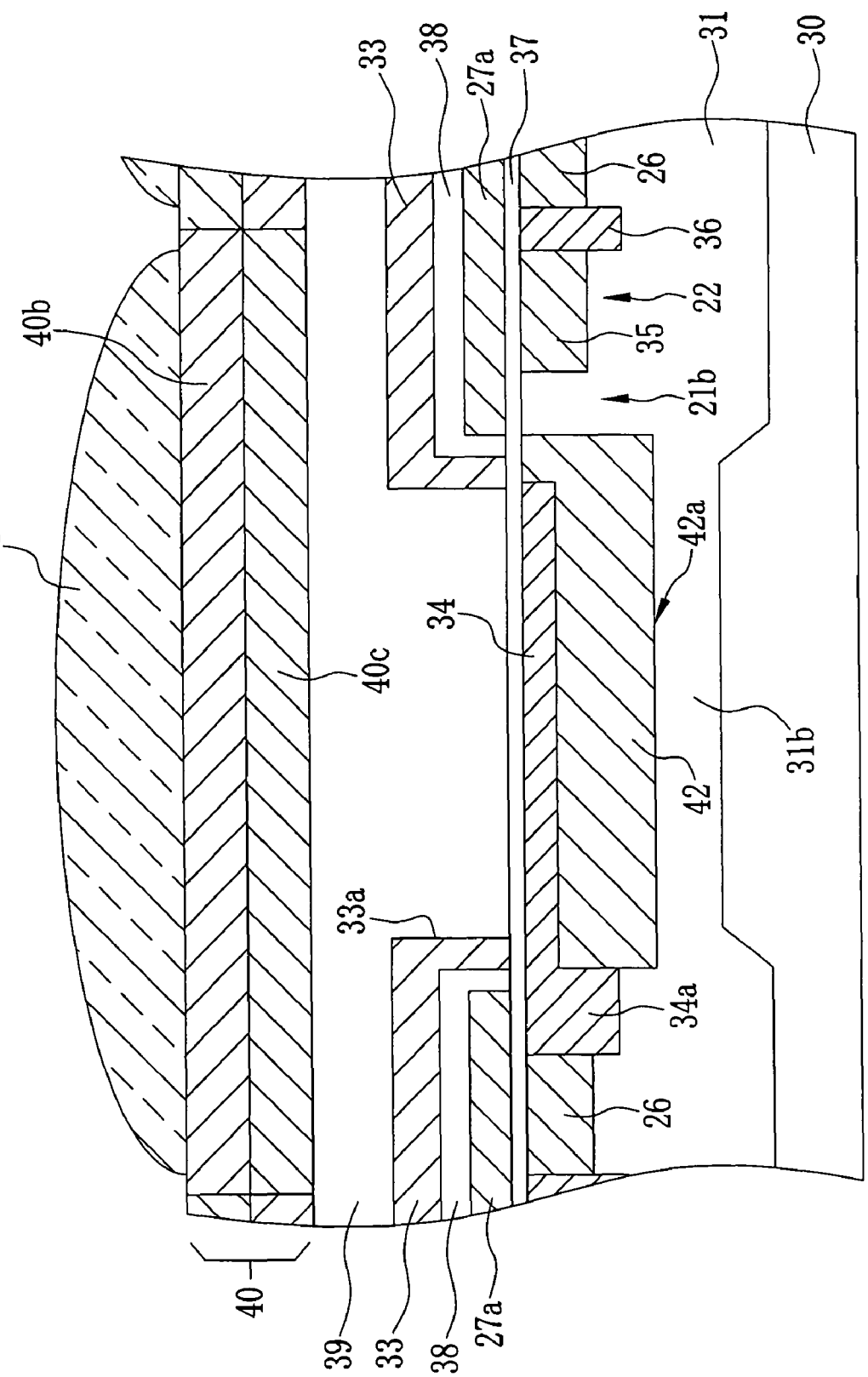
FIG. 5 is a schematic section view taken along II-II line shown in FIG. 2.

FIG. 5 is a section view taken along the II-II line of FIG. 2 and showing the pixel including the G-light receive element 20b. This pixel is identical with that shown in FIG. 4 except a structure of the signal charge accumulator and the optical filter. In view of this, only the different parts are described below.

With respect to this pixel, a G-signal charge accumulator 42 is formed in the p well layer 31 located under the opening 33a. A pn junction 42a is formed at an interface of the G-signal charge accumulator 42 and the underlying p well layer 31 to compose a photodiode for photoelectrically converting the G-light and for producing the G-signal charge. The pn junction 42a is formed at a position deeper than the above-described pn junction 32a so as to have high sensitivity relative to the G-light whose wavelength is longer than the B-light and whose distance entering the p well layer 31 is much deeper. The p well layer 31 is thinly formed under the G-signal charge accumulator 42, and this thin portion 31b works as a potential barrier of the VOD. When the VOD pulse is applied to the n-type semiconductor substrate 30, the potential barrier of the thin portion 31b lowers and the signal charge of the G-signal charge accumulator 42 is swept to the n-type semiconductor substrate 30.

The G-signal charge accumulator 42 has an end portion reaching the surface and is separated from the transfer channel 35 via the p well layer 31. This separation portion composes the RG 21b with the vertical transfer electrode 27a located above this separation portion. Further, the G-signal charge accumulator 42 is separated from the drain region 26 via the extension portion 34a of the p⁺ layer 34 working as the channel stopper. Thus, the signal charge of the G-signal charge accumulator 42 is prevented from being swept to the drain region 26.

A G-filter 40c and the aforementioned IR cut filter 40b are stacked in order on the planarizing layer 39 of the pixel concerned. The G-filter 40c transmits only the light included between the visible light and the G-light (wavelength of which is about 500 nm to 600 nm). On the IR cut filter 40b, the microlens 41 is disposed.

Figure 6:
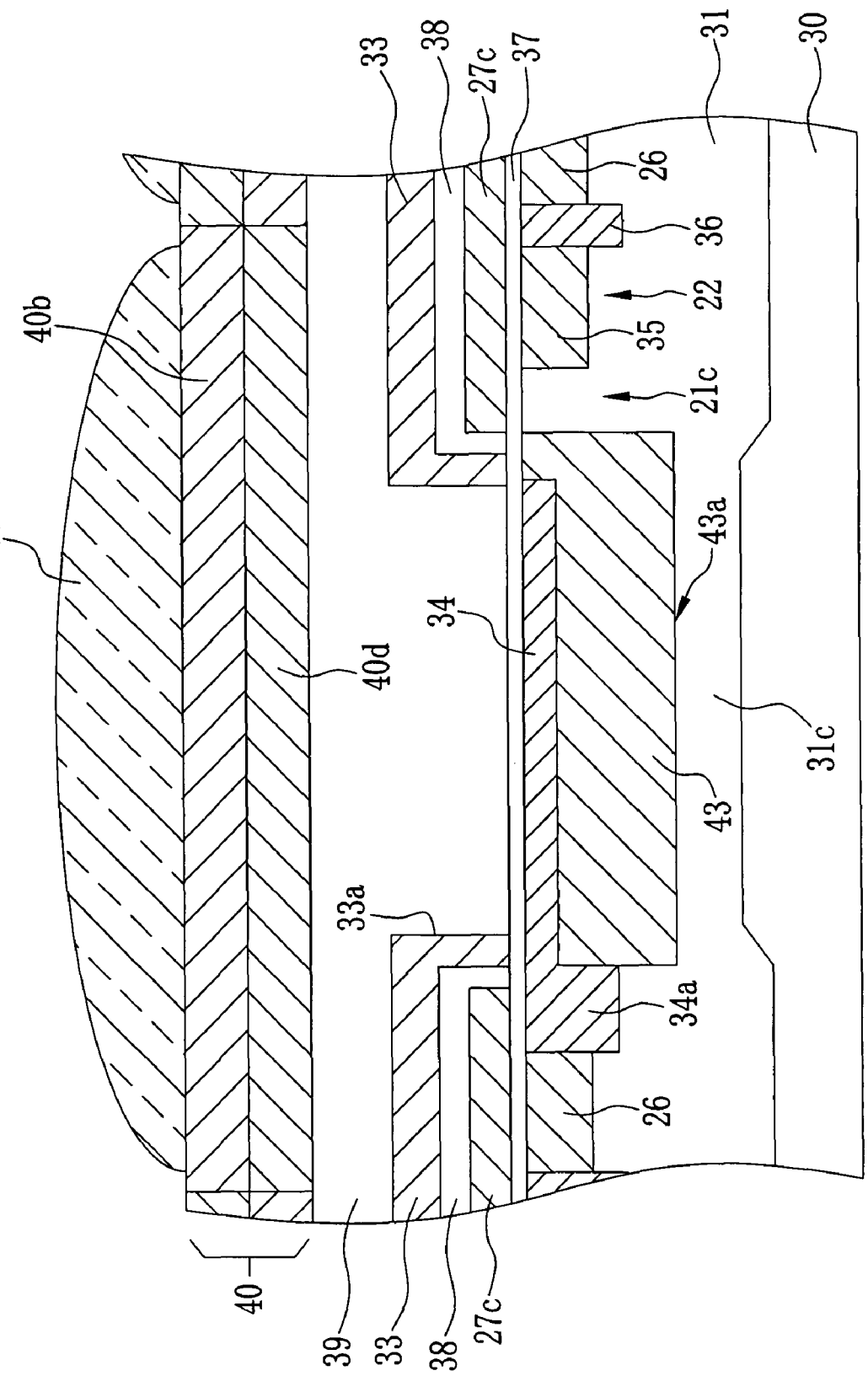
FIG. 6 is a schematic section view taken along III-III line shown in FIG. 2.

FIG. 6 is a section view taken along the III-III line of FIG. 2 and showing the pixel including the R-light receive element 20c. This pixel is identical with those shown in FIGS. 4 and 5 except a structure of the signal charge accumulator and the optical filter. In view of this, only the different parts are described below.

With respect to this pixel, an R-signal charge accumulator 43 is formed in the p well layer 31 located under the opening 33a. A pn junction 43a is formed at an interface of the R-signal charge accumulator 43 and the underlying p well layer 31 to compose a photodiode for photoelectrically converting the R-light and for producing the R-signal charge. The pn junction 43a is formed at a position deeper than the above-described pn junction 42a so as to have high sensitivity relative to the R-light whose wavelength is longer than the G-light and whose distance entering the p well layer 31 is much deeper. The p well layer 31 is thinly formed under the R-signal charge accumulator 43, and this thin portion 31c works as a potential barrier of the VOD. When the VOD pulse is applied to the n-type semiconductor substrate 30, the potential barrier of the thin portion 31c lowers and the signal charge of the R-signal charge accumulator 43 is swept to the n-type semiconductor substrate 30.

The R-signal charge accumulator 43 has an end portion reaching the surface and is separated from the transfer channel 35 via the p well layer 31. This separation portion composes the RG 21c with the vertical transfer electrode 27c located above this separation portion. Further, the R-signal charge accumulator 43 is separated from the drain region 26 via the extension portion 34a of the p⁺ layer 34 working as the channel stopper. Thus, the signal charge of the R-signal charge accumulator 43 is prevented from being swept to the drain region 26.

An R-filter 40d and the aforementioned IR cut filter 40b are stacked in order on the planarizing layer 39 of the pixel concerned. The R-filter 40d transmits only the light included between the visible light and the R-light (wavelength of which is about 600 nm to 700 nm). On the IR cut filter 40b, the microlens 41 is disposed.

Figure 7:
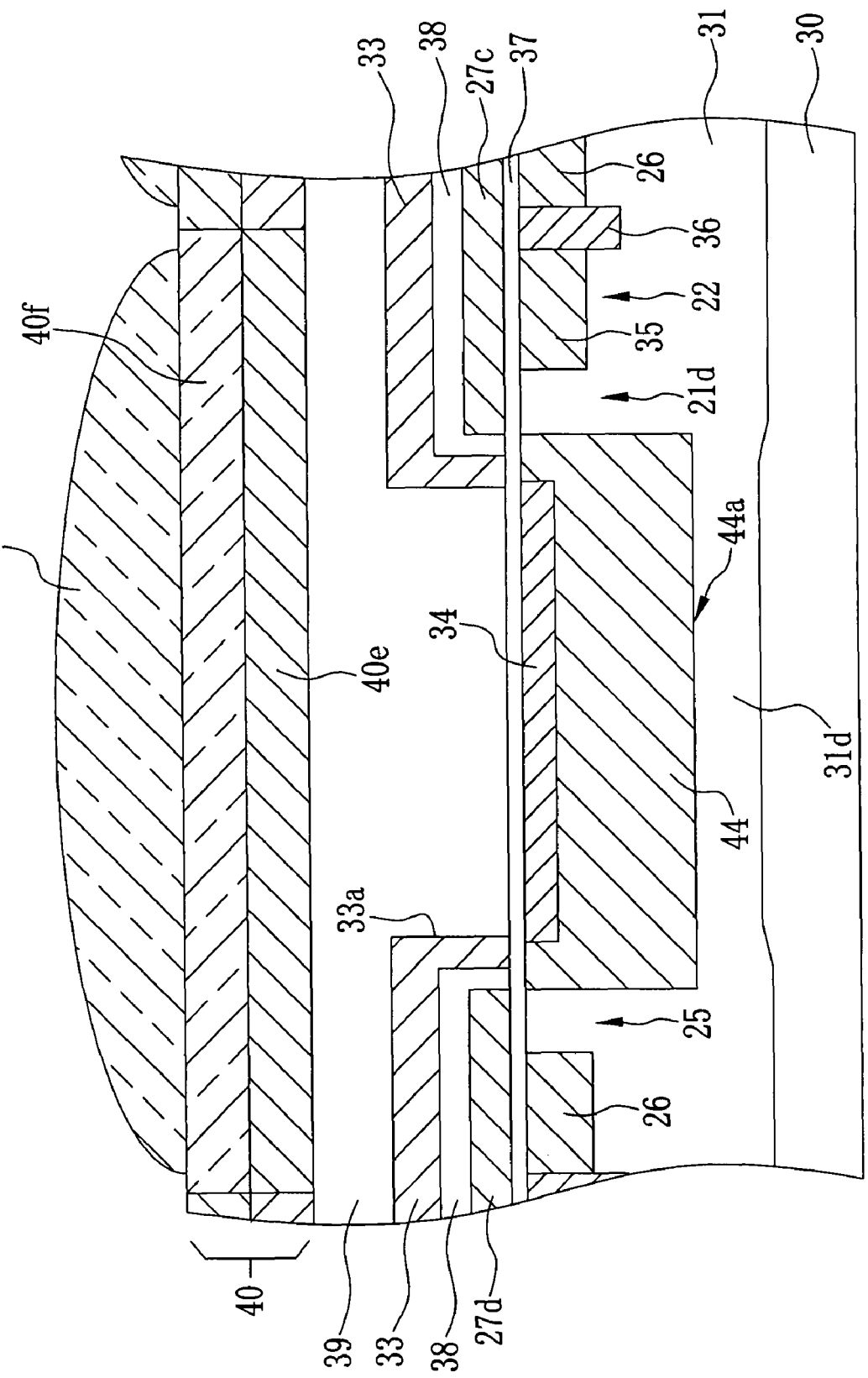
FIG. 7 is a schematic section view taken along IV-IV line shown in FIG. 2.

FIG. 7 is a section view taken along the IV-IV line of FIG. 2 and showing the pixel including the IR-light receive element 20d. This pixel is identical with those shown in FIGS. 4 to 6 except the provision of the EG 25 and a structure regarding the signal charge accumulator and the optical filter. In view of this, only the different parts are described below.

With respect to this pixel, an IR-signal charge accumulator 44 is formed in the p well layer 31 located under the opening 33a. A pn junction 44a is formed at an interface of the IR-signal charge accumulator 44 and the underlying p well layer 31 to compose a photodiode for photoelectrically converting the IR-light and for producing the IR-signal charge. The pn junction 44a is formed at a position deeper than the above-described pn junction 43a so as to have high sensitivity relative to the IR-light whose wavelength is longer than the R-light and whose distance entering the p well layer 31 is much deeper. The p well layer 31 is thinly formed under the IR-signal charge accumulator 44, and this thin portion 31d works as a potential barrier of the VOD. When the VOD pulse is applied to the n-type semiconductor substrate 30, the potential barrier of the thin portion 31d lowers and the signal charge of the IR-signal charge accumulator 44 is swept to the n-type semiconductor substrate 30.

The IR-signal charge accumulator 44 has both end portions reaching the surface. The end portion nearer to the transfer channel 35 is separated from the transfer channel 35 via the p well layer 31. This separation portion composes the RG 21d with the vertical transfer electrode 27c located above this separation portion. The other end portion of the IR-signal charge accumulator 43 nearer to the drain region 26 is similarly separated from the drain region 26 via the p well layer 31. As to this separation portion, a channel stopper (extension portion 34a of the p+ layer 34) is not formed, and the EG 25 is composed of this separation portion and the vertical transfer electrode 27d located above this separation portion. When a high-voltage LOD pulse is applied to the vertical transfer electrode 27d, the potential barrier of the separation portion lowers and the signal charge of the IR-signal charge accumulator 44 is swept to the drain region 26.

A visible-light cut filter 40e and a transparent film 40f are stacked in order on the planarizing layer 39 of the pixel concerned. The visible-light cut filter 40e transmits the IR light (wavelength of which is about 800 nm to 1500 nm) and cuts the visible light. On the transparent film 40f, the microlens 41 is disposed. Incidentally, the transparent film 40f is provided for the purpose of planarizing a portion located under the microlens 41. However, instead of providing the transparent film 40f, the under portion of the microlens 41 may be planarized by adjusting a thickness of each optical film composing the spectroscopic layer 40. Alternatively, another planarizing layer for covering the entire spectroscopic layer 40 may be provided under the microlens 41.

FIG. 8 shows drive timing of the solid-state imaging device 6 and emission timing of the IR emitting device 4. In addition, FIG. 8 shows image production timing of the signal processor 11. With reference to this timing chart, an operation of the range image system 2 is described below.

The VOD pulse, the LOD pulse and the read pulse are outputted form the TG 7 and are inputted into the solid-state imaging device 6 every one-frame scanning period (one vertical scanning period). Moreover, irradiation of the IR pulse is performed by the IR emitting device 4 every other one-frame scanning period. The scanning period of the frame is defined by a cycle of the read pulse to be inputted. The period during which the emission of the IR pulse is performed is referred to as first frame scanning period. The period during which the emission of the IR pulse is not performed is referred to as second frame scanning period. In the respective frame scanning periods, the signal charge stored in the preceding frame scanning period is read and transferred, and then, is outputted as the pixel signal.

At the outset, the VOD pulse is inputted into the solid-state imaging device 6 in the first frame scanning period. Upon this, the potential barrier lowers at the thin portions 31a to 31d of the p well layer 31, and the signal charges stored in the signal charge accumulators 32 and 42 to 44 of the light receive elements 20a to 20d are swept to the n-type semiconductor substrate 30. Thus, all the signal charge accumulators 32 and 42 to 44 are set to an empty state.

Successively, the IR pulse having a pulse width t1 is emitted from the IR emitting device 4. After that, the LOD pulse is inputted into the solid-state imaging device 6 when a time t2 has passed. Upon this, the signal charge stored in the IR-signal charge accumulator 44 of the IR-light receive element 20d is swept to the drain region 26 via the EG 25. From this moment, the IR-light receive element 20d commences exposure. After that, the read pulse is inputted into the solid-state imaging device 6 when a time t3 has passed. In response to this read pulse, the signal charges stored in the signal-charge accumulators 32 and 42 to 44 of the light receive elements 20a to 20d are transferred to the vertical CCD 22 via the readout gates 21. At this moment, the exposure of the respective light receive elements 20a to 20d is terminated. The time t3 is the light receiving time (signal-charge storing time) of the IR-light receive element 20d. Meanwhile, a time t4 elapsing from the input of the VOL pulse to the input of the read pulse is the light receiving time of the light receive elements 20a to 20c of B, G and R. Incidentally, the light receiving time t3 of the IR-light receive element 20d is set to a value substantially identical with the pulse width t1 so as to receive the light corresponding to one pulse of the IR pulse reflected from the subject.

In the succeeding second frame scanning period, the vertical and horizontal transfer pulses not shown in the drawing are inputted into the solid-state imaging device 6 to vertically and horizontally transfer the signal charge stored in the preceding first frame scanning period so that the pixel signal of one frame (first frame signal) is sequentially outputted from the output amplifier 24. While the first frame signal is outputted, the VOD pulse is inputted into the solid-state imaging device 6 and all the signal charge accumulators 32 and 42 to 44 are set to the empty state similarly to the above. In the second frame scanning period, the IR pulse is not emitted form the IR emitting device 4 and the exposure of the IR-light receive element 20d is commenced by inputting the LOD pulse into the solid-state imaging device 6. After that, the read pulse is inputted into the solid-state imaging device 6 when the time t3 has passed. The signal charges stored in the signal charge accumulators 32 and 42 to 44 of the light receive elements 20a to 20d are transferred to the vertical CCD 22 via the RG 21 to complete the exposure of the respective light receive elements 20a to 20d. In the second frame scanning period, timing of the respective pulses is identical with that of the first frame scanning period except that the IR pulse is not emitted. During the second frame scanning period, the IR-light receive element 20d receives IR-light component of the ambient light.

In the succeeding first frame scanning period, the vertical and horizontal transfer pulses not shown in the drawing are inputted into the solid-state imaging device 6 to vertically and horizontally transfer the signal charge stored in the preceding second frame scanning period so that the pixel signal of one frame (second frame signal) is sequentially outputted from the output amplifier 24. While the second frame signal is outputted, the VOD pulse is inputted into the solid-state imaging device 6. After that, the respective pulses are inputted into the solid-state imaging device 6 at timing identical with the forgoing, and the operations are similarly repeated. Meanwhile, in each of the first frame scanning periods, the range images of different-distance positions are obtained in order by changing the time t2 (corresponding to the above-mentioned TOF τ) defining the reception timing of the IR pulse. Similarly to the foregoing, when the velocity of light is denoted by c and the L denotes a distance extending to a subject of which the range image is obtained, the time t2 is determined as t2=2 L/c on the basis of the relationship of L=c·t2/2.

The first frame signal outputted in the second frame scanning period and the second frame signal outputted in the first frame scanning period are digitized by the A/D converter 8 and are recorded via the recording-destination changer 9 in the first and second frame memories 10a and 10b respectively. The signal processor 11 produces the first visible-light image from the pixel signal (S1BGR) of B, G and R included in the first frame signal recorded in the first frame memory 10a. The produced first visible-light image is recorded in the image memory 12. In addition, the signal processor 11 produces the second visible-light image from the pixel signal (S2BGR) of B, G and R included in the second frame signal recorded in the second frame memory 10b. The produced second visible-light image is recorded in the image memory 12. Further, the range image is produced by subtracting the pixel signal (S2IR) of IR included in the second frame signal, from the pixel signal (S1IR) of IR included in the first frame signal. The produced range image is recorded in the image memory 12.

As described in the above, the range image system 2 performs imaging every one-frame scanning period and emits the IR pulse every other one-frame scanning period. Thus, two pixel signals S1IR and S2IR are alternately obtained. The pixel signal S1IR includes the reflected light (signal component) of the IR pulse, which is obtained from the subject, and the IR-light component (noise component) included in the ambient light. The pixel signal S2IR includes only the IR-light component (noise component) of the ambient light. By subtracting the pixel signal S2IR from the pixel signal S1IR, it is possible to produce the range image from which the noise component is removed and whose SN ratio is improved.

The solid-state imaging device 6 equipped in the range image system 2 is capable of receiving the IR light in addition to the visible light. Moreover, among the receive elements 20a to 20d, only the IR receive element 20d is provided with the LOD to constitute the charge discharging mechanism, which is independent from the VOD acting for the whole of the receive elements 20a to 20d, so that it is possible to control the IR-light receiving period independently from the visible-light receiving period. The structure of the range image system 2 is simplified by employing the solid-state imaging device 6. Thus, the range image system 2 may be downsized and the cost thereof may be lowered.

In the above embodiment, as shown in FIG. 8, the pixel signal (S2IR) included in the second frame signal, which is outputted in the first frame scanning period, is subtracted from the pixel signal (S1IR) included in the first frame signal, which is outputted in the preceding second frame scanning period, to produce the range image. However, the present invention is not limited to this. The pixel signal (S2IR) included in the second frame signal, which is outputted in the first frame scanning period, may be subtracted form the pixel signal (S1IR) included in the first frame signal, which is outputted in the succeeding second frame scanning period.

As to the above embodiment, the first and second frame memories 10a and 10b are independently shown in FIG. 1. However, the structure of the independent memory chips is not exclusive. The present invention includes a structure in that the first and second frame memories 10a and 10b are constituted as a unitized memory chip.

In FIG. 2 of the above embodiment, the drain region 26 composing the LOD is disposed for each vertical row of the light receive elements 20a to 20d and is connected to the IR-light receive element 20d of the corresponding row. However, the present invention is not limited to this. The formation of the drain region 26 may be properly changed. For instance, the drain region 26 may be individually disposed for each IR-light receive element 20d.

In FIG. 2 of the above embodiment, the light receive elements 20a to 20d are arranged in the square lattice form as a whole. However, the present invention is not limited to this. The light receive elements 20a to 20d may be arranged in a honeycomb lattice form in which the vertical rows of the light receive elements being adjacent in the horizontal direction are shifted in the vertical direction by half a pitch (half a pixel-arrangement pitch).

In the solid-state imaging device 6 of the above embodiment, the conductivity type (p-type or n-type) of the respective parts is set so as to deal with the electron, which is included in a pair of the electron and the hole produced by photoelectrical conversion of the photodiode, as the signal charge. However, the present invention is not limited to this. The conductivity type of the respective parts may be reversed so as to deal with the hole, which has opposite polarity to the electron, as the signal charge.

Although the present invention has been fully described by way of the preferred embodiments thereof with reference to the accompanying drawings, various changes and modifications will be apparent to those having skill in this field. Therefore, unless otherwise these changes and modifications depart from the scope of the present invention, they should be construed as included therein.

What is claimed is:

1. A range image system comprising:
an infrared emitting device for emitting infrared pulsed light to a scene;
an imaging device in which first light receive elements for receiving visible light and second light receive elements for receiving infrared light are two-dimensionally disposed, said imaging device photoelectrically converting the visible light and the infrared light of said scene received by said first and second light receive elements to output a first pixel signal, which corresponds to a charge amount of a signal charge accumulated in said first light receive element, and a second pixel signal, which corresponds to a charge amount of a signal charge accumulated in said second light receive element, in time series;
an imaging controller for activating said imaging device to periodically output the first and second pixel signals of one frame every one-frame scanning period, said imaging controller delaying a light-receiving period of said second light receive element from the emission of said pulsed light of said infrared emitting device by a predetermined time so as to receive the pulsed light reflected from a predetermined distance position;

an emission controller for controlling emission timing of said infrared emitting device to perform emission of said pulsed light every other one-frame scanning period;

a first frame memory for storing the first and second pixel signals of one frame obtained by imaging of emission time of said pulsed light;

a second frame memory for storing the first and second pixel signals of one frame obtained by imaging of non-emission time of said pulsed light; and a signal processor for producing a first visible-light image based on said first pixel signal stored in said first frame memory, and for producing a second visible-light image based on said first pixel signal stored in said second frame memory, said signal processor producing a range image by subtracting said second pixel signal stored in said second frame memory from said second pixel signal stored in said first frame memory, wherein said imaging device is a solid-state imaging device including a semiconductor substrate of a first conductivity type, in a surface layer of which a well layer of a second conductivity type is formed, said imaging device further including:

a vertical overflow drain for sweeping the signal charges of said first and second light receive elements to said semiconductor substrate;

a lateral overflow drain for sweeping the signal charge of said second light receive element to a drain region of the first conductivity type, which is formed in said well layer, via an elimination gate;

readout gates for reading the signal charges from said first and second light receive elements;

a vertical transfer portion for vertically transferring the signal charge read by said readout gate;

a horizontal transfer portion for receiving the respective signal charges from said vertical transfer portion to horizontally transfer the received signal charges; and a signal output portion for outputting the pixel signal after converting the signal charge, which is horizontally transferred by said horizontal transfer portion, into the pixel signal in accordance with the charge amount of the signal charge, wherein said imaging controller individually sets light-receiving periods of said visible light and said infrared light so as to make these periods different from each other by activating said imaging device in an order of sweeping the signal charges from said first and second light receive elements through said vertical overflow drain, sweeping the signal charge from said second light receive element through said lateral overflow drain, and reading the signal charges from said first and second light receive elements through said readout gates.

2. The range image system according to claim 1, further comprising:
an image memory for storing said first and second visible-light images and said range image produced by said signal processor.

3. The range image system according to claim 1, wherein said first light receive elements comprise:
blue-light receive elements for receiving the light of blue included in three primary colors of the visible light;
green-light receive elements for receiving the light of green included in said three primary colors; and
red-light receive elements for receiving the light of red included in said three primary colors.

4. The range image system according to claim 1, wherein said elimination gate and said readout gates are controlled by transfer electrodes of said vertical transfer portion.

5. The range image system according to claim 1, wherein said drain region is disposed so as to confront said vertical transfer portion and so as to interpose the vertical row of said first and second light receive elements between the drain region and the vertical transfer portion.

6. The range image system according to claim 5, wherein said first light receive elements comprise:
blue-light receive elements for receiving the light of blue included in three primary colors of the visible light;
green-light receive elements for receiving the light of green included in said three primary colors; and
red-light receive elements for receiving the light of red included in said three primary colors.

7. The range image system according to claim 6, wherein said first and second light receive elements of the vertical row are cyclically arrayed in an arrangement order of the blue-light receive element, the green-light receive element and the red-light receive element.

8. The range image system according to claim 7, wherein said light receive elements are arranged in matrix.

9. The range image system according to claim 1, further comprising:
a recording-destination changer for changing said first and second frame memories storing said first and second pixel signals, said recording-destination changer changing said first and second frame memories every one-frame scanning period to store said first and second pixel signals.

* * * * *